(12) United States Patent
Li

(10) Patent No.: US 10,115,745 B2
(45) Date of Patent: Oct. 30, 2018

(54) TFT ARRAY SUBSTRATE AND METHOD OF FORMING THE SAME

(71) Applicant: Shenzhen China Star Optoelectronics Technology Co., Ltd., Shenzhen, Guangdong (CN)

(72) Inventor: Jinming Li, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 168 days.

(21) Appl. No.: 15/109,654

(22) PCT Filed: May 12, 2016

(86) PCT No.: PCT/CN2016/081782
§ 371 (c)(1),
(2) Date: Jul. 4, 2016

(87) PCT Pub. No.: WO2017/128554
PCT Pub. Date: Aug. 3, 2017

(65) Prior Publication Data
US 2018/0097021 A1 Apr. 5, 2018

(30) Foreign Application Priority Data
Jan. 28, 2016 (CN) .......................... 2016 1 0058332

(51) Int. Cl.
*H01L 29/76* (2006.01)
*H01L 27/12* (2006.01)
(Continued)

(52) U.S. Cl.
CPC ...... *H01L 27/1259* (2013.01); *H01L 21/0332* (2013.01); *H01L 21/0337* (2013.01);
(Continued)

(58) Field of Classification Search
CPC . H01L 51/56; H01L 51/5056; H01L 51/0072; H01L 51/5072; C09K 11/06
(Continued)

(56) References Cited

U.S. PATENT DOCUMENTS

2007/0298548 A1 12/2007 Nagata
2014/0312315 A1* 10/2014 Kang ................. H01L 29/7869
257/40
(Continued)

FOREIGN PATENT DOCUMENTS

CN 101090125 A 12/2007
CN 103295962 A 9/2013
(Continued)

*Primary Examiner* — Andy Huynh
(74) *Attorney, Agent, or Firm* — Andrew C. Cheng

(57) ABSTRACT

The present disclosure proposes a TFT array substrate and a method of forming the same. The TFT array substrate includes a substrate, a semi-conductor layer, a pixel electrode on the substrate so to be on the same layer as the semi-conductor layer, a gate insulating layer, a gate electrode, an ILD layer on the substrate so to cover the gate insulating layer, gate electrode and pixel electrode, a source electrode on the ILD layer and connected to the semi-conductor layer, and a drain electrode on the ILD layer and connected to the semi-conductor layer and pixel electrode. The TFT array substrate can prevent etching of the metal oxide by an etching solution. The TFT array substrate having a top-gate structure, including with a traditional TFT with a top-gate structure, can skip the use of photomask at two occasions during the production process, thus lowers the production cost.

7 Claims, 3 Drawing Sheets

(51) Int. Cl.
*H01L 21/77* (2017.01)
*H01L 21/033* (2006.01)
*H01L 21/28* (2006.01)
*H01L 29/20* (2006.01)
*H01L 29/786* (2006.01)

(52) U.S. Cl.
CPC .............. *H01L 21/28* (2013.01); *H01L 21/77* (2013.01); *H01L 27/12* (2013.01); *H01L 27/124* (2013.01); *H01L 29/20* (2013.01); *H01L 29/786* (2013.01)

(58) Field of Classification Search
USPC ........................................................ 257/338
See application file for complete search history.

(56) References Cited

U.S. PATENT DOCUMENTS

2014/0333864 A1* 11/2014 Miyake ............... H01L 27/1255
349/43
2015/0179679 A1* 6/2015 Im ..................... H01L 21/02532
257/43

FOREIGN PATENT DOCUMENTS

| CN | 103985713 A | 8/2014 |
| CN | 104505372 A | 4/2015 |
| CN | 105514122 A | 4/2016 |

* cited by examiner

TFT ARRAY SUBSTRATE AND METHOD OF FORMING THE SAME

BACKGROUND OF THE INVENTION

1. Field of the Invention

The present invention relates to the field of wafer fabrication and panel display technology, and more specifically, to a thin-film transistor (TFT) array substrate and the method of forming the same.

2. Description of the Prior Art

In most cases, a semi-conductor layer in a TFT is composed of metal oxide films, which are extremely sensitive to acid. Even a weak acid can quickly erode the oxide semi-conductor layer. Therefore, the oxide semi-conductor layer is easily damaged in the process of etching a metal source electrode and drain electrode on it.

In addition, given that an oxide semi-conductor layer is thin, usually between 30 nm to 50 nm, it takes only a few seconds, even with a diluted hydrofluoric (HF) acid solution having a concentration of 500:1, to etch the oxide semi-conductor layer. However, most metal requires a strong acid and long period of time to be etched. Thus how to etch a metal source electrode and drain electrode on an oxide semi-conductor layer becomes a difficulty that must be overcome immediately.

SUMMARY OF THE INVENTION

The order to resolve the problem resulted from insufficiencies of existing technology, the present invention provides a TFT array substrate and a method of forming the same that prevent etching of the metal oxide by a metal etching solution and requires less use of a photomask.

In one aspect of the present invention, a thin-film transistor (TFT) array substrate comprises: a substrate; a semi-conductor layer formed on the substrate; a pixel electrode formed on the substrate so to be on the same layer as the semi-conductor layer; a gate insulating layer formed on the semi-conductor layer; a gate electrode formed on the gate insulating layer; an interlayer dielectric (ILD) layer formed on the substrate so to cover the gate insulating layer, gate electrode and pixel electrode; a source electrode disposed on the ILD layer and electrically connected to the semi-conductor layer; and a drain electrode disposed on the ILD layer and electrically connected to the semi-conductor layer and pixel electrode.

According to an exemplary embodiment, the ILD layer comprises a layer of silicon nitride ($SiN_x$) or a compound layer formed by silicon oxide ($SiO_x$) layers and $SiN_x$ layers, from bottom to top.

According to an exemplary embodiment, the TFT array substrate further comprises: a passivation layer formed on the ILD layer so to cover the source electrode and drain electrode; and a common electrode formed on the passivation layer.

In another aspect of the present invention, a method of forming a TFT array substrate comprises: forming a semi-conductor layer on the substrate; forming a gate insulating layer on the semi-conductor layer, with the gate insulating layer covering part of the semi-conductor layer; forming a gate electrode on the gate insulating layer; forming an ILD layer on the semi-conductor layer so to cover the gate insulating layer and the gate electrode, wherein the ILD layer comprises a $SiN_x$ layer; annealing the ILD layer so that hydrogen in the ILD layer is diffused into the semi-conductor layer so to form a pixel electrode on the part where the semi-conductor layer is not covered by the gate insulating layer; forming a contact hole on the ILD layer and the gate insulating layer so to expose the semi-conductor layer, and forming an opening on the ILD layer so to expose the pixel electrode; forming a source electrode and a drain electrode on the ILD layer, wherein the source electrode electrically connects the semi-conductor layer through the contact hole, and the drain electrode electrically connects the semi-conductor layer and pixel electrode through the contact hole and the opening.

According to an exemplary embodiment, a step of forming the semi-conductor layer comprises: depositing metal oxide on the substrate; activating the metal oxide through annealing; undertaking lithography and etching so to form the semi-conductor layer with a pre-determined pattern.

According to an exemplary embodiment, a step of forming the gate insulating layer comprises: depositing an insulating layer on the semi-conductor layer; undertaking lithography and etching so to form the gate insulating layer with a pre-determined pattern; wherein the insulating layer comprises a single layer of $SiN_x$ or a compound layer formed by deposited $SiO_x$ layers and $SiN_x$ layers, from bottom to top.

According to an exemplary embodiment, a step of forming the gate electrode comprises: depositing a metal layer on the gate insulating layer; undertaking lithography and etching so to form the gate electrode with a pre-determined pattern.

According to an exemplary embodiment, the ILD layer further comprises a $SiO_x$ layer, or deposited $SiO_x$ layers and $SiN_x$ layers, from bottom to top.

According to an exemplary embodiment, the method further comprises: forming a passivation layer on the ILD layer so to cover the source electrode and drain electrode; and forming a common electrode on the passivation layer.

According to an exemplary embodiment, a step of forming the common electrode comprises: depositing an electrode layer on the passivation layer; undertaking lithography and etching so to form the common electrode with a pre-determined pattern.

The TFT array substrate and method of forming the same can prevent etching of the metal oxide by a metal etching solution. In addition, the TFT array substrate comprising a top-gate structure of the present invention, comparing with a traditional TFT with a top-gate structure, can skip the use of photomask at two occasions during the production process, thus lowers the production cost.

DETAILED DESCRIPTION OF PREFERRED EMBODIMENTS

The drawings illustrate embodiments of the invention and, together with the description, serve to explain the principles of the invention.

For better understanding embodiments of the present invention, the following detailed description taken in conjunction with the accompanying drawings is provided. Apparently, the accompanying drawings are merely for some of the embodiments of the present invention. Any ordinarily skilled person in the technical field of the present invention could still obtain other accompanying drawings without use laborious invention based on the present accompanying drawings.

FIG. 1 through FIG. 8, as a whole, show a process of fabricating a TFT array substrate according to a preferred embodiment of the present invention.

Figure 1:
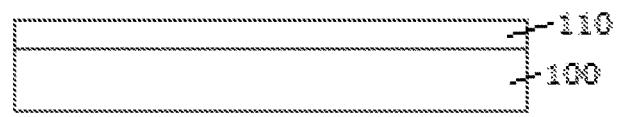
FIG. 1 through FIG. 8 show a process of fabricating a TFT array substrate according a preferred embodiment of the present invention.

As FIG. 1 shows, a semi-conductor layer 110 is formed on a substrate 100. The substrate 100 can, but is not limited to, be made of transparent glass materials mainly composed of silicon dioxide ($SiO_2$).

The semi-conductor layer 110 is usually formed by physical vapor deposition (PVD). More specifically, after some metal oxide is deposited on the substrate 100 by PVD, the metal oxide is annealed, such as in a temperature ranging from 200° C. to 400° C., to activate the metal oxide. Then lithography and etching is undertaken to form a semi-conductor layer 110 with a pre-determined pattern.

The metal oxide forming the semi-conductor layer 110 can be, but is not limited to, indium gallium zinc oxide (IGZO); any suitable metal oxide may apply to the present invention. In one exemplary embodiment of the present invention, the thickness of the semi-conductor layer 110 can be, but is not limited to, 300 Å to 1000 Å.

Figure 2:
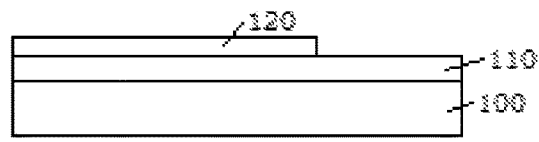

Then, in FIG. 2, a gate insulating layer 120 is formed on the semi-conductor layer 110. The gate insulating layer 120 covers part of the semi-conductor layer 110, which can support a gate electrode. The part of the semi-conductor layer 110 which is not covered by the gate insulating layer 120 can provide room for the forming of a pixel electrode. More specifically, an insulating layer is deposited on a part of the semi-conductor layer 110 through plasma-enhanced chemical vapor deposition (PECVD), and then, lithography and etching is undertaken to form a gate insulating layer 120 with a pre-determined pattern.

The insulating layer can be composed of a single layer or multiple layers. The single layer can be an inorganic layer made of silicon nitride ($SiN_x$). The multiple layers can be inorganic layers made of silicon oxide ($SiO_x$) or $SiN_x$. When the insulating layer is composed of multiple layers, it can a compound layer formed by deposited $SiO_x$ layers and $SiN_x$ layers, from bottom to top.

Figure 3:
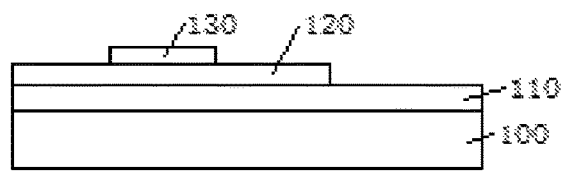

Then, FIG. 3 shows the forming of a gate electrode 130 on the gate insulating layer 120. More specifically, a metal layer, such as a layer of molybdenum (Mo), can be deposited by PVD on the gate insulating layer 120. Then, lithography and etching is undertaken to form a gate electrode 130 with a pre-determined pattern. In a non-limiting embodiment of the present invention, materials for the metal layer is not limited to Mo, but can also be aluminum (Al), copper (Cu) or a combination of all these materials. The thickness of the gate electrode 130 can be, but is not limited to, 1500 Å to 6500 Å.

Figure 4:
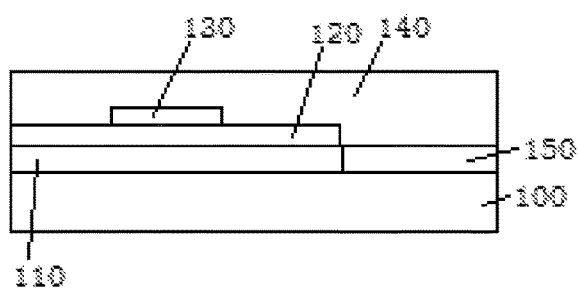
Figure 5:
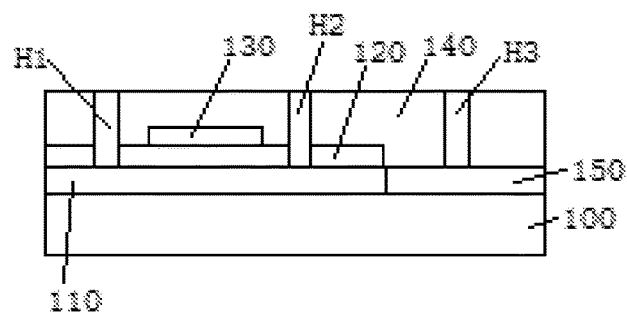

FIG. 4 and FIG. 5 show the forming of an interlayer dielectric (ILD) layer 140 on the semi-conductor layer 110 so to cover the gate electrode 130 and the gate insulating layer 120, so that the part where the semi-conductor layer 110 is not covered by the gate insulating layer 120 can form a pixel electrode 150. More specifically, a metal layer is deposited through PECVD on the semi-conductor layer 110. The metal layer can be a single layer of $SiO_x$ or a compound layer formed by deposited $SiO_x$ layers and $SiN_x$ layers, from bottom to top. Then, the metal layer is annealed so that the hydrogen in the $SiN_x$ is diffused into the semi-conductor layer 110, so to get a hydrogen-doped semi-conductor layer 110, and form the pixel electrode 150 on the part where the semi-conductor layer 110 is not covered by the gate insulating layer 120. And then, lithography and etching is undertaken to form a contact hole H1 where a source electrode can electrically connect the semi-conductor layer 110, a contact hole H2 where a drain electrode can electrically connect the semi-conductor layer 110 and the pixel electrode 150, and an opening H3.

The top-gate structure adopted by the TFT of the TFT array substrate of the present invention can effectively prevent erosion of metal oxide by the metal etching solution.

Figure 6:
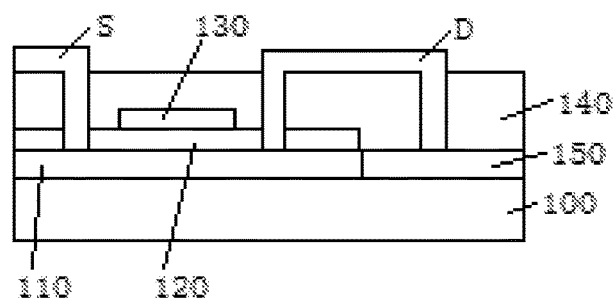

Then, FIG. 6 shows the forming of a source electrode S and a drain electrode D on the ILD layer 140. More specifically, first, Al/Mo materials are deposited on the ILD layer 140. Then, lithography and etching is undertaken to get a source electrode S and drain electrode D with pre-determined patterns. The materials to form the source electrode S and the drain electrode D are not limited to Al/Mo; any suitable material can apply to the present invention. In one embodiment of the present invention, the thickness of the source electrode S and drain electrode D can be, but is not limited to, 200 Å to 6000 Å.

Figure 7:
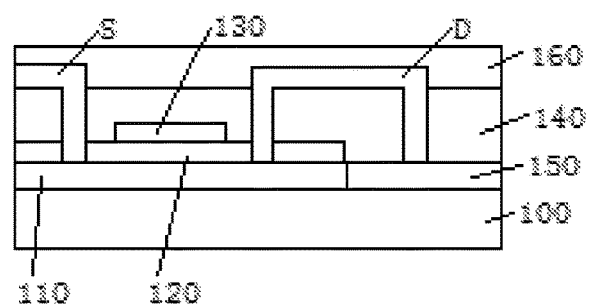

Then, FIG. 7 shows the forming of a passivation layer 160 on the ILD layer 140 so to cover the source electrode S and drain electrode D. More specifically, a passivation layer 160 is deposited through PECVD so to protect the source electrode S and drain electrode D. In an exemplary embodiment of the present invention, the passivation layer 160 can be a single layer structure comprising a layer of $SiO_x$, or a compound layer structure comprising multiple layers of $SiO_x$ and $SiN_x$. In one embodiment of the present invention, the thickness of the passivation layer 160 can be, but is not limited to, 150 Å to 4000 Å.

Figure 8:
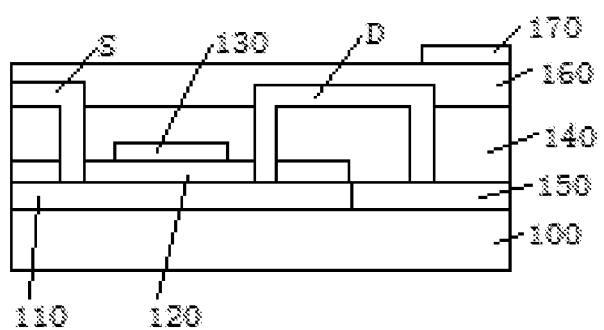

Then, FIG. 8 shows the forming of a common electrode 170 on the passivation layer 160. More specifically, an electrode layer is deposited through PVD, then lithography and etching is undertaken so to get the common electrode 170 with a pre-determined pattern. In a non-limiting embodiment of the present invention, the common electrode 170 can be an indium tin oxide (ITO) layer or a layer made of other suitable transparent conductors. In an embodiment of the present invention, the thickness of the common electrode 170 can be, but is not limited to, 300 Å to 1000Å.

The TFT array substrate of the present invention, because the semi-conductor layer and the pixel electrode is formed on the same layer, it does not require the use of a photomask to prevent the forming of contact holes on the passivation layer, nor the use of a photomask in the forming of the pixel electrode. Therefore, the production cost is lowered and the production procedure is simplified.

In addition, the present invention can prevent the etching of metal oxide by the metal etching solution as it adopts a top-gate structure.

While the present invention has been described in connection with what is considered the most practical and preferred embodiments, it is understood that this invention is not limited to the disclosed embodiments but is intended to cover various arrangements made without departing from the scope of the broadest interpretation of the appended claims.

What is claimed is:

1. A method of forming a thin-film transistor (TFT) array substrate, comprising:
    forming a semi-conductor layer on a substrate, wherein the semi-conductor layer is a single continuous layer of a semi-conductor material formed on the substrate;
    forming a gate insulating layer on the semi-conductor layer, such that the gate insulating layer covers a first part of the semi-conductor layer with a second part of the semi-conductor layer being exposed as being not covered by the gate insulating layer, wherein the first part and the second part are both integral parts of the semi-conductor layer and adjoin each other;

forming a gate electrode on the gate insulating layer;

forming an ILD layer on the semi-conductor layer so as to cover the gate insulating layer and the gate electrode, wherein the ILD layer comprises a $SiN_x$ layer that is in direct contact with the second part of the semi-conductor layer;

annealing the ILD layer so that hydrogen in the ILD layer is diffused into the second part of the semi-conductor layer to form a pixel electrode with the second part of the semi-conductor layer that is not covered by the gate insulating layer;

forming contact holes in the ILD layer and the gate insulating layer so as to expose spaced portions of the first part of the semi-conductor layer, and forming an opening in the ILD layer so as to expose a portion of the pixel electrode; and forming a source electrode and a drain electrode on the ILD layer, wherein the source electrode electrically connects the semi-conductor layer through a first one of the contact holes, and the drain electrode electrically connects the semi-conductor layer and pixel electrode through a second one of the contact holes and the opening, respectively;

wherein the second part of the semi-conductor layer that is diffused with hydrogen of the ILD layer is an integral part of the semi-conductor layer and is in direct contact and connection with the first part of the semi-conductor layer so that the pixel electrode is directly connected to the first part of the semi-conductor layer that is not diffused with hydrogen.

2. The method of claim 1, wherein a step of forming the semi-conductor layer comprises:
   depositing metal oxide on the substrate;
   activating the metal oxide through annealing;
   undertaking lithography and etching so as to form the semi-conductor layer with a pre-determined pattern.

3. The method of claim 1, wherein a step of forming the gate insulating layer comprises:
   depositing an insulating layer on the semi-conductor layer;
   undertaking lithography and etching so as to form the gate insulating layer with a pre-determined pattern; wherein the insulating layer comprises a single layer of $SiN_x$ or a compound layer formed by depositing $SiO_x$ layers and $SiN_x$ layers, from bottom to top.

4. The method of claim 1, wherein a step of forming the gate electrode comprises:
   depositing a metal layer on the gate insulating layer;
   undertaking lithography and etching so as to form the gate electrode with a pre-determined pattern.

5. The method of claim 1, wherein the ILD layer further comprises a $SiO_x$ layer, or deposited $SiO_x$ layers and $SiN_x$ layers, from bottom to top.

6. The method of claim 1 further comprising:
   forming a passivation layer on the ILD layer so as to cover the source electrode and drain electrode;
   forming a common electrode on the passivation layer.

7. The method of claim 6, wherein a step of forming the common electrode comprises:
   depositing an electrode layer on the passivation layer;
   undertaking lithography and etching so as to form the common electrode with a pre-determined pattern.

* * * * *